(12) United States Patent
Jeong et al.

(10) Patent No.: US 11,205,389 B2
(45) Date of Patent: Dec. 21, 2021

(54) SCAN DRIVER AND DISPLAY DEVICE HAVING SAME

(71) Applicant: LG Display Co., Ltd., Seoul (KR)

(72) Inventors: Yongmin Jeong, Paju-si (KR); Sunghun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/071,613

(22) Filed: Oct. 15, 2020

(65) Prior Publication Data

US 2021/0118374 A1 Apr. 22, 2021

(30) Foreign Application Priority Data

Oct. 16, 2019 (KR) .......................... 10-2019-0128595

(51) Int. Cl.
*G09G 3/3266* (2016.01)
*G09G 3/20* (2006.01)

(52) U.S. Cl.
CPC ......... *G09G 3/3266* (2013.01); *G09G 3/2092* (2013.01); *G09G 2310/0286* (2013.01); *G09G 2310/0289* (2013.01)

(58) Field of Classification Search
CPC ............... G09G 3/3266; G09G 3/2092; G09G 2310/0286; G09G 2310/0289; G09G 2320/045; G09G 2310/0262; G09G 2300/0426; G09G 2300/0842; G09G 2300/0819; G09G 3/007; G09G 2310/0264; G09G 2310/06; G11C 19/28
See application file for complete search history.

(56) References Cited

U.S. PATENT DOCUMENTS

| | | | |
|---|---|---|---|
| 2017/0061878 A1* | 3/2017 | Park | G09G 3/3233 |
| 2017/0116925 A1* | 4/2017 | Lee | G11C 19/28 |
| 2021/0074203 A1* | 3/2021 | Kim | G09G 3/3266 |

* cited by examiner

Primary Examiner — Premal R Patel
(74) Attorney, Agent, or Firm — Birch, Stewart, Kolasch & Birch, LLP

(57) ABSTRACT

Proposed is a display device including a display panel displaying an image and a scan driver having a scan signal generation circuit that supplies a scan signal to the display panel, the scan signal generation circuit including a first transistor controlling charging and discharging of a Q node, a second transistor controlling charging and discharging of a QB node, a third transistor resetting the QB node, a fourth transistor outputting a scan signal of a logic low level in response to a potential of the Q node, and a fifth transistor outputting a scan signal of a logic high level in response to a potential of the QB node.

11 Claims, 12 Drawing Sheets

(a)

(b)

SCAN DRIVER AND DISPLAY DEVICE HAVING SAME

CROSS REFERENCE TO RELATED APPLICATIONS

The application claims the priority benefit of Korean Patent Application No. 10-2019-0128595 filed in the Republic of Korea on Oct. 16, 2019, the entire contents of which is hereby expressly incorporated herein by reference for all purposed as if fully set forth herein into the present application.

BACKGROUND OF THE INVENTION

Field of the Invention

The present disclosure generally relates to a scan driver and a display device having the same.

Description of the Related Art

With the development of information technology, the market for a display device that is a connection medium between a user and information is growing. Accordingly, the use of display devices such as a light emitting display (LED), a quantum dot display (QDD), a liquid crystal display (LCD) is increasing.

The display devices described above include a display panel including sub-pixels, a driving unit outputting a driving signal to drive the display panel, and a power supply unit generating power to be supplied to the display panel and/or driving unit. The driving unit includes a scan driver supplying a scan signal (or gate signal) to the display panel, a data driver supplying a data signal to the display panel, and the like.

In the display devices, when a driving signal, such as a scan signal and a data signal, is supplied to the sub-pixels formed on the display panel, the selected sub-pixel transmits light or emits light directly, thereby displaying an image.

SUMMARY OF THE INVENTION

An objective of the present disclosure is to provide a shift register and a display device having the same, which are capable of simplifying the circuit configuration in such a manner as to stably output a scan signal even when a clock signal and a constant voltage are used at a minimum.

Another objective of the present disclosure is to provide an improved scan driver and an improved display device having the scan driver, which address the limitations and problems associated with the related art.

In order to achieve the objective(s), the present disclosure provides a display device, including: a display panel displaying an image; and a scan driver having a scan signal generation circuit that supplies a scan signal to the display panel, wherein the scan signal generation circuit include a first transistor controlling charging and discharging of a Q node, a second transistor controlling charging and discharging of a QB node, a third transistor resetting the QB node, a fourth transistor outputting a scan signal of a logic low level in response to a potential of the Q node, and a fifth transistor outputting a scan signal of a logic high level in response to a potential of the QB node.

At least one of the first to fifth transistors can be a p-type thin film transistor.

The scan signal generation circuit can be connected to two clock signal lines, one start signal line, and one constant voltage line.

The third transistor can have a diode connection state in which a gate electrode and a first electrode are commonly connected.

The first transistor can have a gate electrode connected to a second clock signal line through which a second clock signal is transmitted, a first electrode connected to a first clock signal line through which a first clock signal is transmitted, and a second electrode connected to the Q node, the second transistor can have a gate electrode connected to the Q node, a first electrode connected to a start signal line through which a start signal is transmitted, and a second electrode connected to the QB node, the third transistor can have a gate electrode and a first electrode connected to the second clock signal line, and a second electrode connected to the QB node, the fourth transistor can have a gate electrode connected to the Q node, a first electrode connected to the first clock signal line, and a second electrode connected to an output terminal of the scan signal generation circuit, and the fifth transistor can have a gate electrode connected to the QB node, a first electrode connected to a scan high voltage line through which a scan high voltage is transmitted, and a second electrode connected to an output terminal of the scan signal generation circuit.

The scan signal generation circuit can further include a first capacitor having one end connected to the Q node and the other end connected to the output terminal of the scan signal generation circuit; and a second capacitor having one end connected to the QB node and the other end connected to the scan high voltage line.

The second clock signal can be generated as a logic low level in synchronization with a logic low level of the start signal during a first time period, and then generated as a logic high level during a second time period, the first clock signal is generated as a logic high level during the first time period and then generated as a logic low level during the second time period, and the second clock signal and the first clock signal have a logic low level that is non-overlapping with each other.

According to another aspect, the present disclosure a scan driver including a level shifter; and a shift register having a scan signal generation circuit that operates based on a two-phase clock signal output from the level shifter, wherein the shift register includes a first transistor controlling charging and discharging of a Q node, a second transistor controlling charging and discharging of a QB node, a third transistor resetting the QB node, a fourth transistor outputting a scan signal of a logic low level in response to a potential of the Q node, and a fifth transistor outputting a scan signal of a logic high level in response to a potential of the QB node.

The first transistor can have a gate electrode connected to a second clock signal line through which a second clock signal is transmitted, a first electrode connected to a first clock signal line through which a first clock signal is transmitted, and a second electrode connected to the Q node, the second transistor can have a gate electrode connected to the Q node, a first electrode connected to a start signal line through which a start signal is transmitted, and a second electrode connected to the QB node, the third transistor can have a gate electrode and a first electrode connected to the second clock signal line, and a second electrode connected to the QB node, the fourth transistor can have a gate electrode connected to the Q node, a first electrode connected to the first clock signal line, and a second electrode connected to an output terminal of the scan signal generation circuit, and the fifth transistor can have a gate electrode connected to the QB node, a first electrode connected to a scan high voltage line through which a scan high voltage is transmitted, and a second electrode connected to an output terminal of the scan signal generation circuit.

The scan signal generation circuit can further include a first capacitor having one end connected to the Q node and the other end connected to the output terminal of the scan signal generation circuit; and a second capacitor having one end connected to the QB node and the other end connected to the scan high voltage line.

The present disclosure has an effect of providing an improved scan driver and an improved display device having the same, which are capable of simplifying the circuit configuration in such a manner as to stably output a scan signal even when a clock signal and a constant voltage are used at a minimum. In addition, according to the present disclosure, since it is possible to significantly reduce the number of transistors, signal lines, and voltage lines included in the shift register when configuring the scan driver, there is an effect of easily implementing the display device with a narrow bezel.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention. In the drawings.

DETAILED DESCRIPTION OF THE EMBODIMENTS

Figure 1:
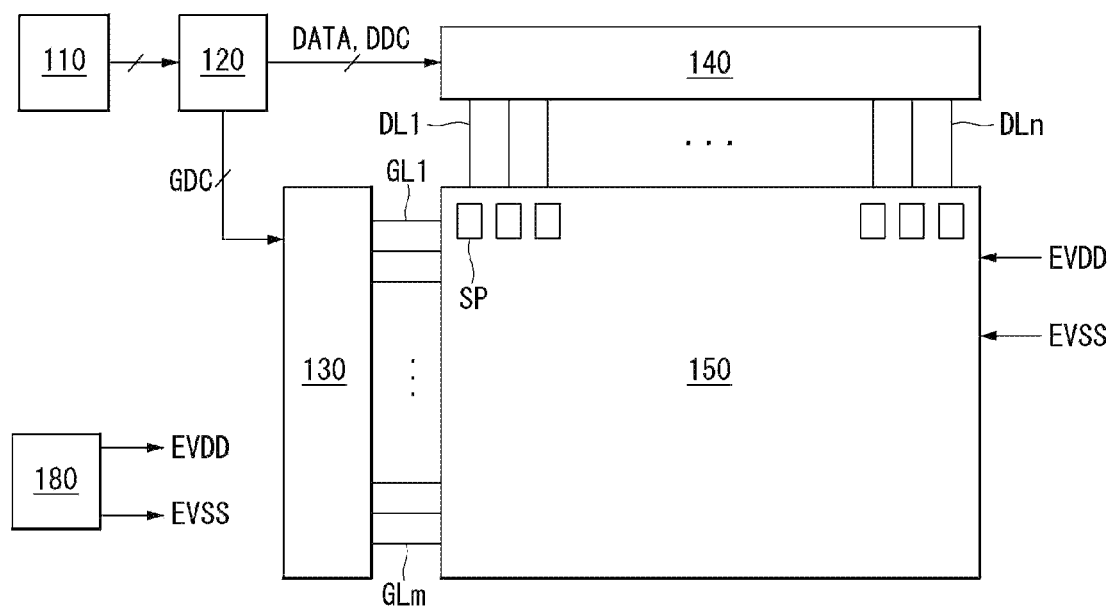
FIG. 1 is a schematic block diagram illustrating an organic electric field light emitting display device according to an embodiment of the present disclosure.

Hereinafter, specific contents for the practice of the present disclosure will be described with reference to the accompanying drawings.

The display device according to one or more embodiments of the present disclosure can be implemented as a television, a video player, a personal computer (PC), a home theater system, an automobile electric device, a smart phone, and the like, but is not limited thereto. The display device according to one or more embodiments of the present disclosure can be implemented as a light emitting display device (LED), a quantum dot display device (QDD), a liquid crystal display device (LCD), or the like. Hereinafter, for convenience of description, a light emitting display device that represents an image in such a manner as to directly emit light will be taken as an example. The light emitting display device can be implemented on the basis of an inorganic light emitting diode or can be implemented on the basis of an organic light emitting diode. Hereinafter, for convenience of description, a display device implemented on the basis of an organic light emitting diode will be described as an example. All the components of the display device according to all embodiments of the present disclosure are operatively coupled and configured.

In addition, a thin film transistor included in the display panel or the scan driver will be described below as an example implemented with an n-type thin film transistor or a p-type thin film transistor. However, the display panel or the scan driver can be also implemented in a form in which n-type thin film transistor and p-type thin film transistor exist together.

The thin film transistor is a three-electrode element including a gate, a source, and a drain. The source is an electrode through which carriers are supplied with the transistor. In the thin film transistor, the carriers begin to flow from the source. The drain is an electrode through which carriers move out of the thin film transistor. For example, the carriers flow from the source to the drain in the thin film transistor.

In the case of an n-type thin film transistor, since the carrier is an electron, a source voltage is lower than a drain voltage so that electrons can flow from the source to the drain. In the n-type thin film transistor, since electrons flow from the source to the drain, an electric current flows from the drain to the source. In contrast, in the case of the p-type thin film transistor, since the carrier is a hole, the source voltage is higher than the drain voltage so that holes can flow from the source to the drain. In the p-type thin film transistor, since holes flow from the source to the drain, an electric current flows from the source to the drain. However, the source and drain of the thin film transistor can be changed to each other according to the applied voltage. Reflecting this, in the following description, any one of the source and the drain is referred to as the first electrode, and the other of the source and the drain is referred to as the second electrode.

Figure 2:
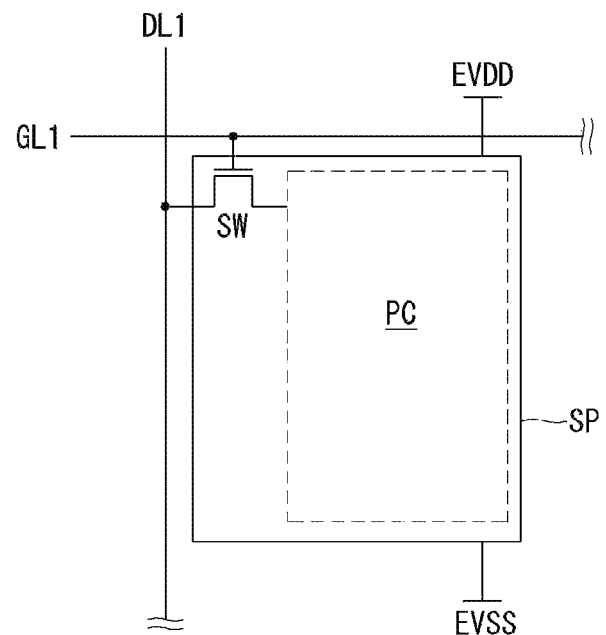
FIG. 2 is a schematic diagram illustrating a configuration of a sub-pixel shown in FIG. 1.

FIG. 1 is a schematic block diagram illustrating an organic electric field light emitting display device according to an embodiment of the present disclosure, and FIG. 2 is a schematic diagram illustrating an example of a sub-pixel (SP) shown in FIG. 1;

As shown in FIGS. 1 and 2, the organic light emitting display device according to an embodiment of the present disclosure includes an image supply unit 110, a timing control unit 120, a scan driver 130, a data driver 140, a display panel 150, and a power supply unit 180.

The image supply unit 110 (or host system) outputs various driving signals in addition to image data signals supplied from the outside or image data signals stored in the internal memory. The image supply unit 110 can supply the data signals and various driving signals to the timing control unit 120.

The timing control unit 120 includes a gate timing control signal GDC for controlling an operation timing of the scan driver 130, a data timing control signal DDC for controlling an operation timing of the data driver 140, and various synchronization signals (e.g., vertical synchronization signal Vsync and horizontal synchronization signal Hsync).

The timing control unit 120 supplies a data signal DATA supplied from the image supply unit 110 to the data driver 140, together with the data timing control signal DDC. The timing control unit 120 can be formed in the form of an integrated circuit (IC) to be mounted on a printed circuit board, but is not limited thereto.

The scan driver 130 outputs a scan signal (or scan voltage) in response to a gate timing control signal GDC supplied from the timing control unit 120. The scan driver 130 supplies scan signals to sub-pixels SPs included in the display panel 150 through scan lines GL1 to GLm, where m is a number such as a positive integer. The scan driver 130 can be formed in the form of an IC or can be directly formed on the display panel 150 in a gate-in-panel manner, but is not limited thereto.

The data driver 140 samples and latches the data signal DATA in response to the data timing control signal DDC, etc. supplied from the timing control unit 120, and converts the data signal of a digital type into a data voltage of an analogue type on the basis of a gamma reference voltage to be output.

The data driver 140 supplies data voltages to sub-pixels included in the display panel 150 through data lines DL1 to DLn, where n is a number such as a positive integer. The data driver 140 is formed in the form of an IC to be mounted on the display panel 150 or on a printed circuit board, but is not limited thereto.

The power supply unit 180 generates and outputs a first panel power EVDD of a high potential and a second panel power EVSS of a low potential on the basis of an external input voltage supplied from the outside. The power supply unit 180 can generate and output a voltage (e.g., scan high voltage, scan low voltage) for driving the scan driver 130, a voltage (drain voltage, half drain voltage) for driving the data driver 140 or the like, in addition to the first panel power EVDD and the second panel power EVSS.

The display panel 150 displays an image in correspondence to a driving signal including the scan signal and the data voltage output from a driver including a scan driver 130 and a data driver 140 and the first panel power EVDD and the second panel power EVSS output from the power supply unit 180. The sub-pixels SPs of the display panel 150 directly emit light.

The display panel 150 can be manufactured on the basis of a substrate having rigidity or ductility such as glass, silicon, and polyimide. In addition, the sub-pixels emitting light can be composed of pixels including red, green, and blue, or pixels including red, green, blue, and white.

For example, as shown in FIG. 2, each or at least one of the sub-pixels SPs of FIG. 1 includes a switching transistor SW and a pixel circuit PC including a driving transistor, a storage capacitor, an organic light emitting diode, and the like. Since a sub-pixel (SP) used in the organic electric field light emitting display device directly emits light, the circuit configuration is complicated. In addition, a compensation circuit, etc. can be varied, which compensates for degradation in an organic light emitting diode that emits light, as well as a driving transistor that supplies driving current to the organic light emitting diode. Therefore, it is noted that the pixel circuit PC included in the sub-pixel SP is shown in a block form.

Meanwhile, in the foregoing, the timing control unit 120, the scan driver 130, and the data driver 140 have been described as if they are individual components. However, one or more of the timing control unit 120, the scan driver 130, and the data driver 140 can be integrated in one IC according to the implementation method of the light emitting display device.

Figure 3:
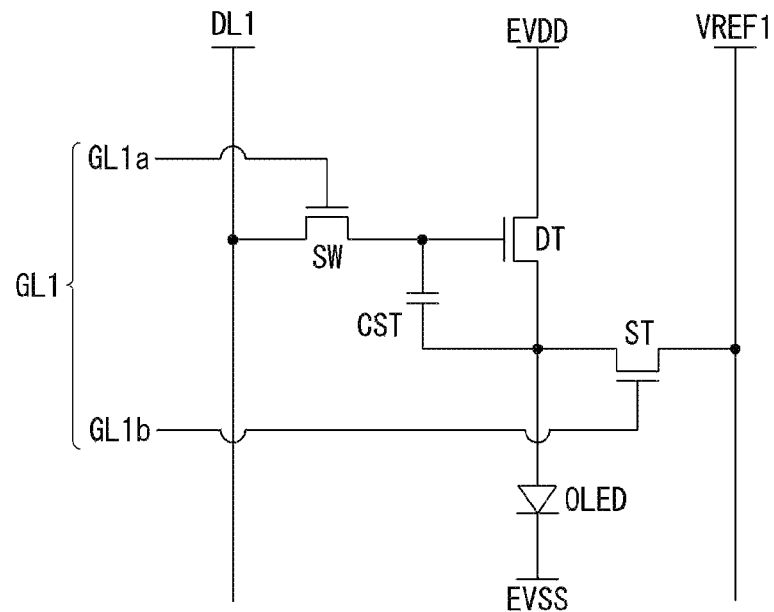
FIG. 3 is an equivalent circuit diagram illustrating a sub-pixel including a compensation circuit according to an embodiment of the present disclosure.
Figure 4:
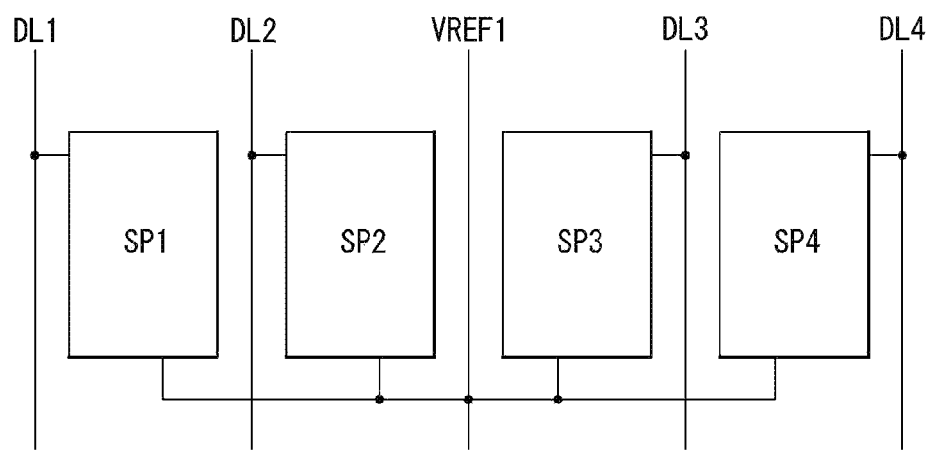
FIGS. 4 and 5 are exemplary diagrams illustrating a pixel capable of being implemented on the basis of the sub-pixel of FIG. 3.
Figure 5:
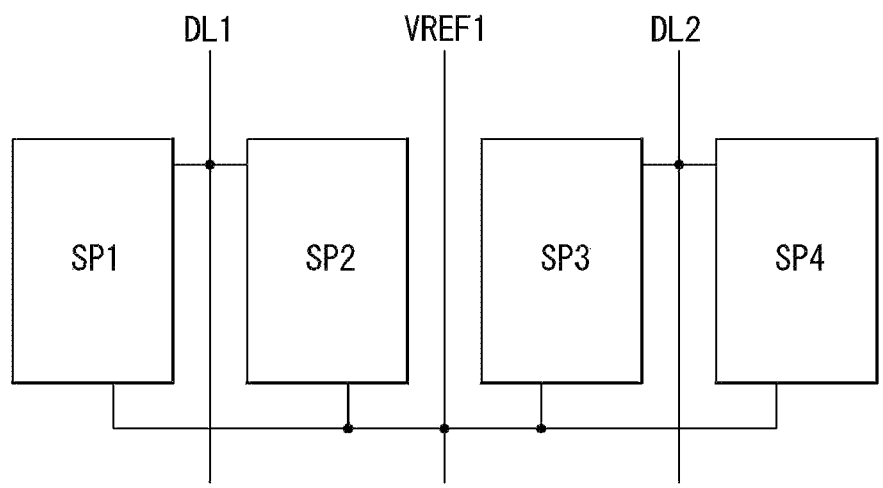

FIG. 3 is an equivalent circuit diagram illustrating a sub-pixel (e.g., SP of FIG. 1) including a compensation circuit according to an embodiment of the present disclosure; and FIGS. 4 and 5 are two example diagrams illustrating a pixel capable of being implemented on the basis of the sub-pixel of FIG. 3.

As illustrated in FIG. 3, a sub-pixel including a compensation circuit according to an embodiment of the present disclosure includes a switching transistor SW, a sensing transistor ST, a driving transistor DT, a capacitor CST, an organic light emitting diode OLED, and the like.

The switching transistor SW has a gate electrode connected to a first scan line A GL1a, a first electrode connected to a first data line DL1, and a second electrode connected to a gate electrode of the driving transistor DT. The driving transistor DT has a gate electrode connected to the capacitor CST, a first electrode connected to a first power line EVDD, and a second electrode connected to an anode electrode of the organic light emitting diode OLED.

The capacitor CST has a first electrode connected to the gate electrode of the driving transistor DT, and a second electrode connected to an anode electrode of the organic light emitting diode OLED. The organic light emitting diode OLED has an anode electrode connected to the second electrode of the driving transistor DT and a cathode electrode connected to a second power line EVSS. The sensing transistor ST has a gate electrode connected to a first scan line B GL1b, a first electrode connected to the sensing line VREF1, and a sensing node (a node in which the second electrode of the driving transistor and the anode electrode of the organic light emitting diode are connected) connected to the second electrode.

The sensing transistor ST is a compensation circuit additionally provided to compensate for degradation or threshold voltage of the driving transistor DT and the organic light emitting diode OLED. The sensing transistor ST acquires a sensing value through a sensing node defined between the driving transistor DT and the organic light emitting diode OLED. The sensing value obtained through the sensing node is transmitted to an external compensation circuit provided outside the sub-pixel through the sensing line VREF1.

The first scan line A GL1a connected to the gate electrode of the switching transistor SW and the first scan line B GL1b connected to the gate electrode of the sensing transistor ST can have a separate structure from each other as shown or have a structure connected in common to each other. The gate electrode common connection structure can reduce the number of scan lines, thereby preventing the reduction of an aperture ratio due to the addition of the compensation circuit.

As shown in two different examples of FIGS. 4 and 5, the first to fourth sub-pixels SP1 to SP4 including the compensation circuit according to an embodiment of the present disclosure can be defined to constitute one pixel. Herein, the first to fourth sub-pixels SP1 to SP4 can be arranged in order of emitting red, green, blue, and white, respectively, but are not limited thereto.

As in the first example of FIG. 4, the first to fourth sub-pixels SP1 to SP4 including the compensation circuit have a structure in which the sub-pixels share one sensing line VREF1 and are connected to the first to fourth data lines DL1 to DL4, respectively.

As in the second example of FIG. 5, the first to fourth sub-pixels SP1 to SP4 including the compensation circuit have a structure in which the sub-pixels are connected to share one sensing line VREF1, and are connected to two data lines in such a manner as to share one data line for two sub-pixels. For example, the first and second sub-pixels SP1 and SP2 can share the first data line DL1 and the third and fourth sub-pixels SP3 and SP4 can share the second data line DL2.

However, FIGS. 4 and 5 show only two examples, and the present disclosure is also applicable to display panels having sub-pixels of other structures described above. In addition, the present disclosure is also applicable to a structure having a compensation circuit in a sub-pixel or a structure without a compensation circuit in a sub-pixel.

Figure 6:
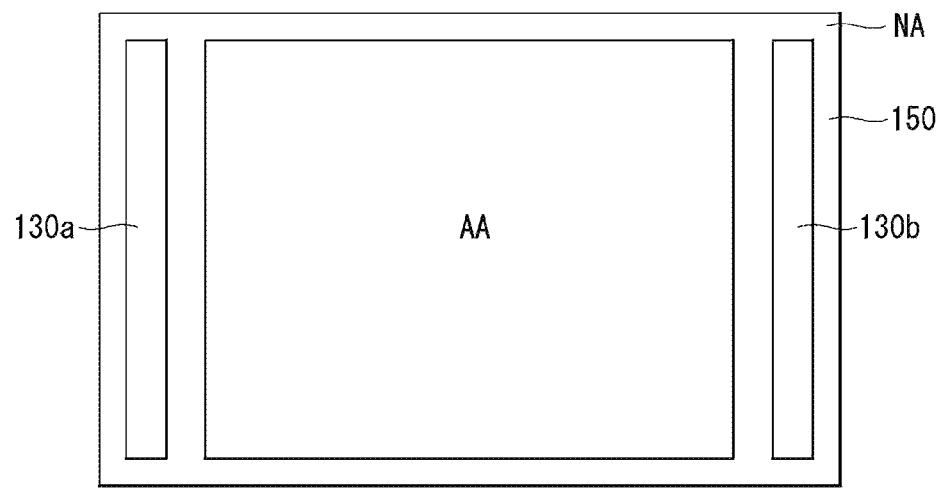
FIG. 6 is an exemplary diagram illustrating a configuration of a gate-in-panel type scan driver according to an embodiment of the present disclosure.
Figure 6:
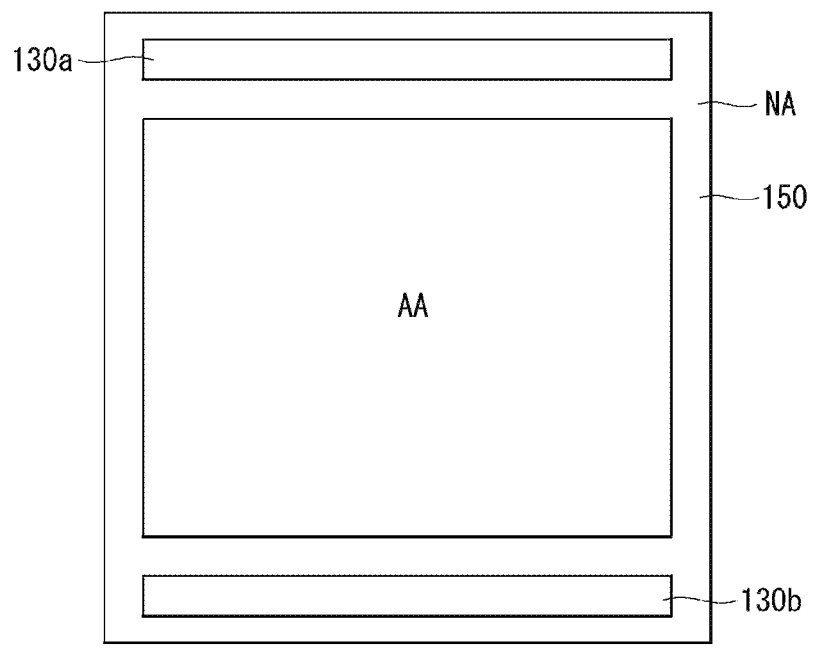
Figure 7:
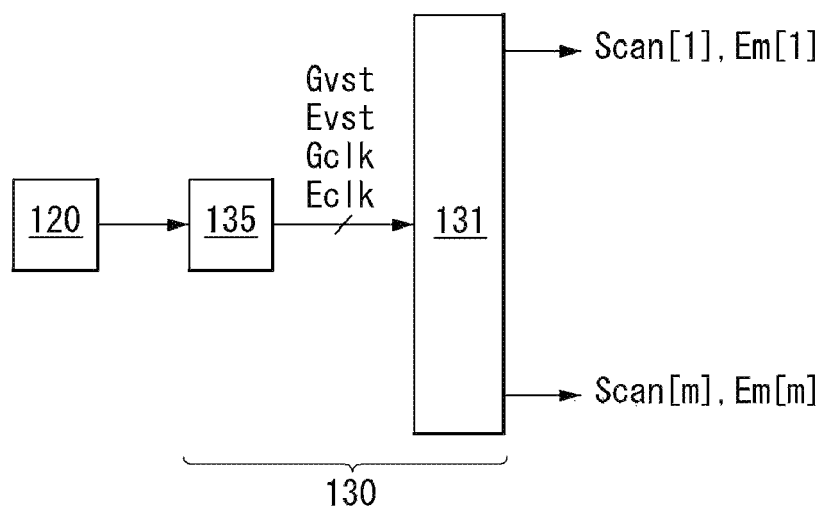
FIG. 7 is an exemplary diagram illustrating a first configuration of a device associated with a gate-in-panel type scan driver.
Figure 8:
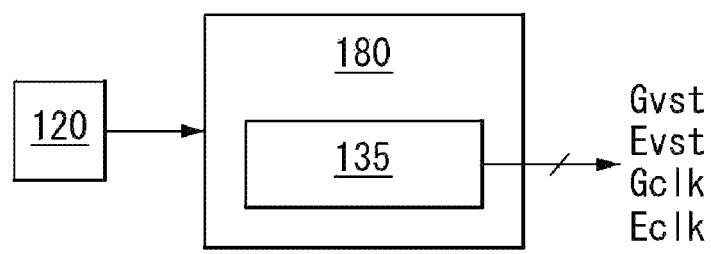
FIG. 8 is an exemplary diagram illustrating a second configuration of a device associated with a gate-in-panel type scan driver.
Figure 9:
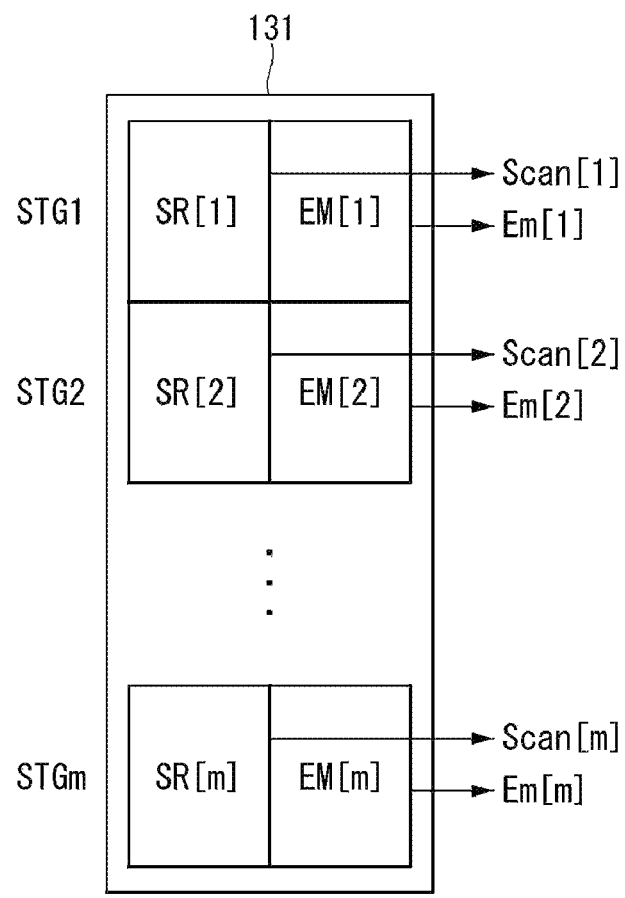
FIG. 9 is an exemplary diagram illustrating a configuration of a shift register.

FIG. 6 is an exemplary diagram illustrating a configuration of a gate-in-panel type scan driver according to an embodiment of the present disclosure; FIG. 7 is an exemplary diagram illustrating a first configuration of a device associated with a gate-in-panel type scan driver; FIG. 8 is an exemplary diagram illustrating a second configuration of a device associated with a gate-in-panel type scan driver; and FIG. 9 is an exemplary diagram illustrating a configuration of a shift register.

As shown in the examples of FIG. 6, gate-in-panel type scan drivers 130a and 130b are disposed in a non-display area NA of the display panel 150. The scan drivers 130a and 130b can be disposed in left and right non-display areas NA of the display panel 150 as shown in (a) of FIG. 6. In addition or as an alternative, scan drivers 130a and 130b can be arranged in upper and lower non-display areas NA of the display panel 150, as shown in (b) of FIG. 6.

Although an example is shown and described in which the scan drivers 130a and 130b are arranged in a pair in the non-display area NA located on the left and right or the upper and lower of the display area AA, the scan drivers 130a and 130b can be arranged only in one of the left, right, upper, or lower sides, and is not limited thereto As shown in FIG. 7, the gate-in-panel type scan driver 130 (e.g., 130a, 130b, etc.) can include a shift register 131 and a level shifter 135. The level shifter 135 generates and outputs a plurality of clock signals Gclk and Eclk and start signals Gvst and Evst on the basis of the signals output from the timing control unit 120. The clock signals Gclk and Eclk can be generated and output in the form of a K-phase (K is an integer equal to or greater than two) having different phases, such as two-phase, four-phase, eight-phase, and the like.

The shift register 131 can operate on the basis of signals Gclk, Eclk, Gvst, and Evst output from the level shifter 135 and output scan signals Scan[1] to Scan[m] and light emission signals Em[1] to Em[m] capable of turning on or off the transistor formed on the display panel. The shift register 131 is formed in the form of a thin film on the display panel in a gate-in-panel manner. Therefore, the portion formed on the display panel in the scan driver 130 can be the shift register 131 (i.e., reference numerals 130a and 130b in FIG. 6 can correspond to a reference numeral 131).

Unlike the shift register 131, the level shifter 135 is formed in the form of an IC. The level shifter 135 can be configured in the form of a separate IC as shown in FIG. 7, as well as can be included inside the power supply unit 180 or inside other device(s) as shown in FIG. 8.

As shown in FIG. 9, the shift register 131 can be composed of a plurality of stages STG1 to STGm. The plurality of stages STG1 to STGm can have a structure connected in dependent ways, and can receive at least one front end output signal or rear end output signal as an input signal (e.g., a start signal).

The stages STG1 to STGm of the shift register 131 include scan signal generation circuits SR[1] to SR[m] and light emission signal generation circuits EM[1] to EM[m], respectively. For example, the first stage STG1 generates a first scan signal generation circuit unit SR[1] outputting a first scan signal Scan[1] and a light emitting signal generation circuit EM[1] outputting a light emitting signal Em[1]

The scan signal generation circuits SR[1] to SR[m]) output the scan signals Scan[1] to Scan[m] through the scan lines of the display panel (e.g., the display panel 150). The light emitting signal generation circuits EM[1] to EM[m]) output the light emitting signals Em[1] to Em[m] through the light emitting signal lines of the display panel.

The scan signals Scan[1] to Scan[m] can be used as signals for driving the A-th transistor (e.g., switching transistor, etc.) included in the sub-pixels (e.g., SPs). In addition, the emission signals Em[1] to Em[m] can be used as a signal for driving the B-th transistor (e.g., emission control transistor, etc.) included in the sub-pixels. For example, when the light emission control transistors of the sub-pixels are controlled using the light emission signals Em[1] to Em[m], the light emission time of the organic light emitting diode is varied. However, the example of FIG. 9 is only described for understanding the shift register 131, and the present disclosure is not limited thereto and can be implemented in a form of outputting more various and more signals.

Figure 10:
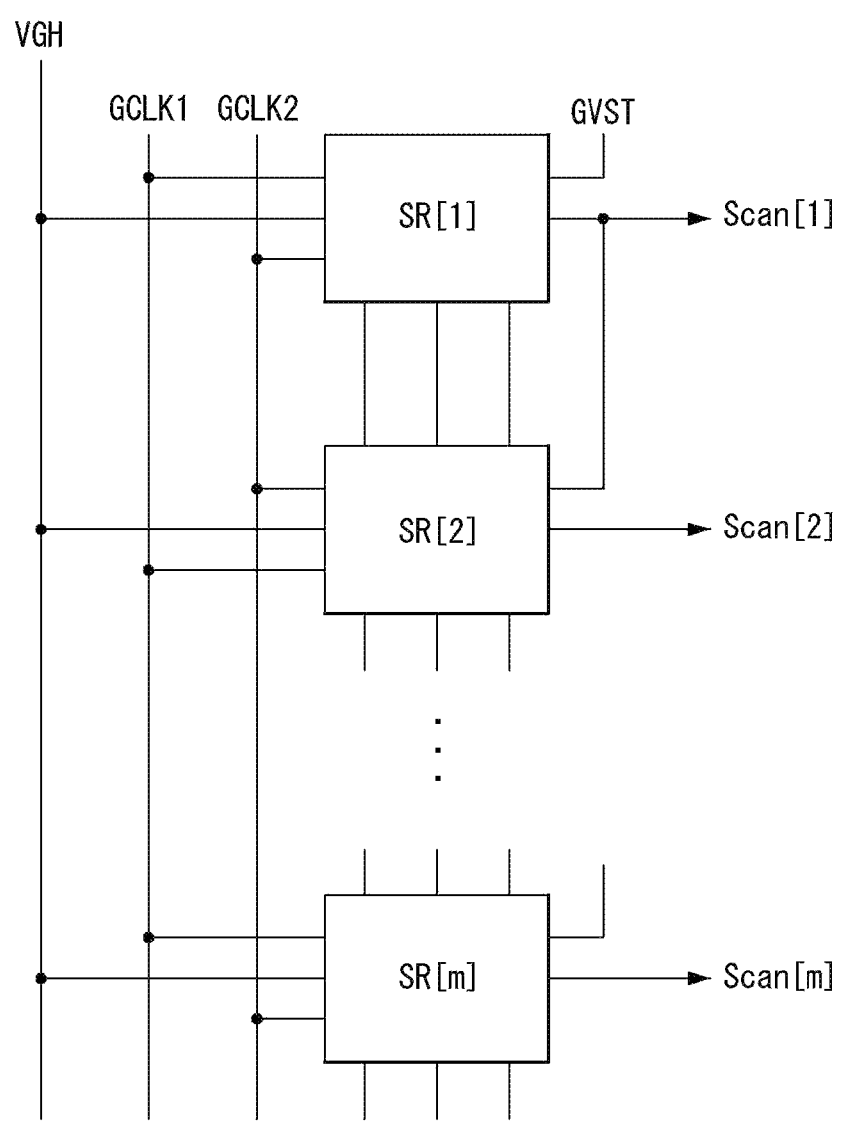
FIG. 10 is a diagram illustrating a configuration of a scan signal generation circuit unit for each stage according to an embodiment of the present disclosure.
Figure 11:
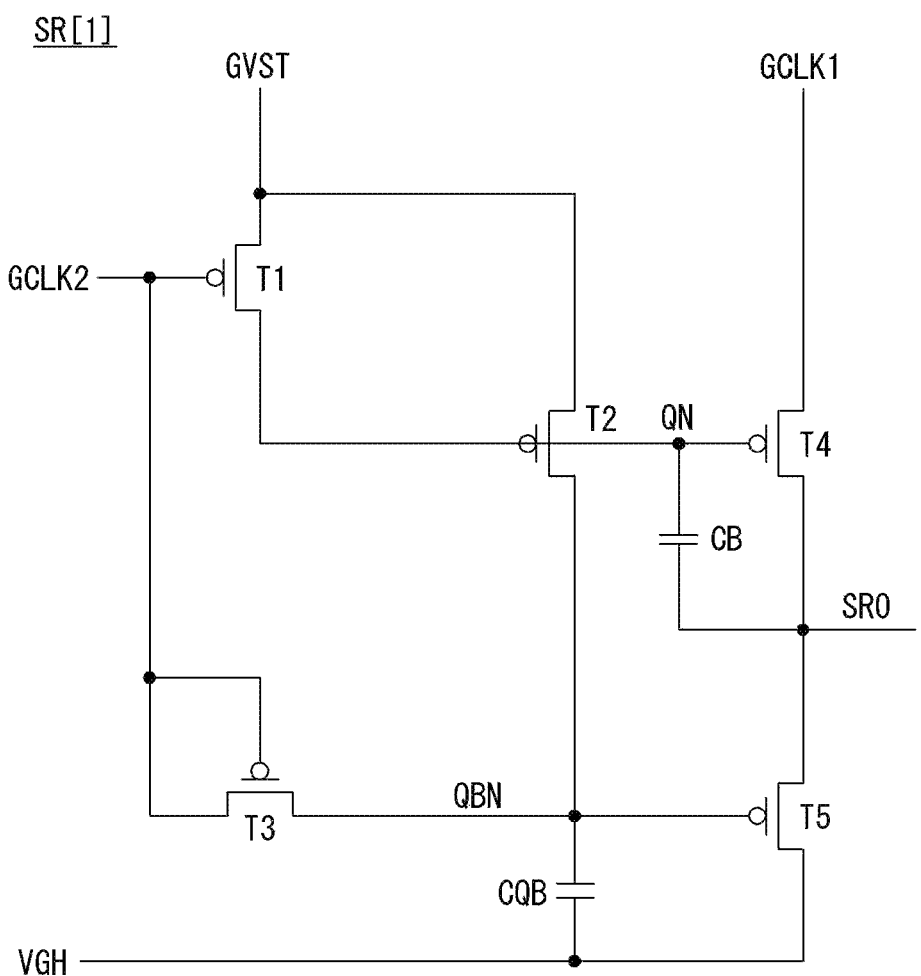
FIG. 11 is an exemplary diagram showing a detailed circuit configuration of a scan signal generation circuit unit of the first stage shown in FIG. 10.

FIG. 10 is a diagram illustrating a configuration of a scan signal generation circuit unit for each stage according to an embodiment of the present disclosure, and FIG. 11 is an exemplary diagram showing a detailed circuit configuration of the scan signal generation circuit portion of the first stage shown in FIG. 10.

As shown in FIG. 10, the scan signal generation circuits SR[1] to SR[m] is connected to a first clock signal line GCLK1 through which a first clock signal is transmitted, and a second clock signal line GCLK2 through which a second clock signal is transmitted, and a scan high voltage line VGH (or constant voltage line) through which a scan high voltage is transmitted. The scan signal generation circuits SR[1] to SR[m] have a structure connected in dependent way and receive a front end output signal as an input signal (e.g., start signal).

For example, the first scan signal generation circuit SR[1] is connected to a start signal line GVST through which the start signal is transmitted, the first clock signal line GCLK1 through which the first clock signal is transmitted, the second clock signal line GCLK2 through which the second clock signal is transmitted, and the scan high voltage line VGH through which the scan high voltage is transmitted.

Meanwhile, the second scan signal generation circuit SR[2] is connected to an output terminal (a terminal to which Scan[1] is output) of the first scan signal generation circuit SR[1], the first clock signal line GCLK1 through which the first clock signal is transmitted, the second clock signal line GCLK2 through which the second clock signal is transmitted, and the scan high voltage line VGH through which the scan high voltage is transmitted.

As a result, the first scan signal generation circuit SR[1] starts operation on the basis of the start signal, but the second scan signal generation circuit SR[2] starts the operation on the basis of the first scan signal Scan[1] output from the first scan signal generation circuit SR[1], instead of the start signal. Such connection structure corresponds to the second scan signal generation circuit SR[2] to the M-th scan signal generation circuit SR[m].

Meanwhile, the scan signal generation circuits SR[1] to SR[m] operate on the basis of a two-phase clock signal, and thus are alternated for each stage in the case of a target (transistor) to which the first clock signal line GCLK1 and the second clock signal line GCLK2 are connected, which will be described in detail with respect to FIG. 11 below.

Hereinafter, the configuration and connection relationship of circuits included in scan signal generation circuits SR[1] to SR[m] are described as follows. However, for ease of understanding, the description will be made on the basis of the first scan signal generation circuit SR[1].

As shown in FIG. 11, the first scan signal generation circuit SR[1] includes a first transistor T1, a second transistor T2, a third transistor T3, a fourth transistor T4, a fifth transistor T5, a first capacitor CB, and a second capacitor CQB. The first transistor T1, the second transistor T2, the third transistor T3, the fourth transistor T4, and the fifth transistor T5 are exemplified as p-type thin film transistors, but are not limited thereto.

The first transistor T1 has a gate electrode connected to a second clock signal line GCLK2 through which a second clock signal is transmitted, a first electrode connected to a start signal line GVST through which a start signal is transmitted, and a second electrode connected to a Q node QN. The first transistor T1 is turned on when the second clock signal of a logic low level is applied through the second clock signal line GCLK2. The first transistor T1 can be defined as a transistor that controls charging and discharging of the Q node QN.

The second transistor T2 has a gate electrode connected to the Q node QN, a first electrode connected to the start signal line GVST through which the start signal is transmitted, and a second electrode connected to a QB node QBN. The second transistor T2 is turned on when a potential of the Q node QN is a logic low level. The second transistor T2 can be defined as a transistor that controls charging and discharging of the QB node QBN.

The third transistor T3 has a gate electrode and a first electrode connected to the second clock signal line GCLK2 through which the second clock signal is transmitted, and a second electrode connected to the QB node QBN. The third transistor T3 has a diode connection state in which the gate electrode and the first electrode are commonly connected. The third transistor T3 is turned on when the second clock signal of a logic low level is applied through the second clock signal line GCLK2. The third transistor T3 can be defined as a transistor that controls the reset of the QB node QBN.

The fourth transistor T4 has a gate electrode connected to the Q node QN, a first electrode connected to the first clock signal line GCLK1, and a second electrode connected to an output terminal SRO of the first scan signal generation circuit SR[1]. The fourth transistor T4 is turned on when a potential of the Q node QN is a logic low level. The fourth transistor T4 can be defined as an output buffer driving a voltage (signal) output through an output terminal SRO of the first scan signal generation circuit SR[1].

The fifth transistor T5 has a gate electrode connected to the QB node QBN, a first electrode connected to a scan high voltage line VGH through which a scan high voltage is transmitted, and second electrode connected to the output terminal SRO of a first scan signal generation circuit SR[1]. The fifth transistor T5 is turned on when a potential of the QB node QBN is logic low level. The fifth transistor T5 can be defined as an output buffer driving a voltage (signal) output through the output terminal SRO of the first scan signal generation circuit SR[1].

The first capacitor CB has one end connected to the Q node QN and the other end connected to the output terminal SRO of the first scan signal generation circuit SR[1]. The first capacitor CB is provided to maintain the potential of the Q node QN and to stably drive the output terminal SRO of the first scan signal generation circuit SR[1] through a Q-node boost. For example, the first capacitor CB serves to stabilize the output of the first scan signal generation circuit SR[1].

The second capacitor CQB has one end connected to the QB node QBN and the other end connected to the scan high voltage line VGH through which the scan high voltage is transmitted. The second capacitor CQB is provided to maintain the potential of the QB node QBN.

Meanwhile, as briefly mentioned above, the scan signal generation circuits operate on the basis of a two-phase clock signal and thus are alternated for each stage in the case of a target (transistor) to which the first clock signal line GCLK1 and the second clock signal line GCLK2 are connected.

Therefore, the first scan signal generation circuit SR[1] is provided so that the second clock signal line GCLK2 is connected to the gate electrode of the first transistor T1 and the first clock signal line GCLK1 is connected to the first electrode of the fourth transistor T4. Meanwhile, the second scan signal generation circuit disposed on the next stage of the first scan signal generation circuit SR[1] is provided so that the first clock signal line GCLK1 is connected to the gate electrode of the first transistor T1 and the second clock signal line GCLK2 is connected to the first electrode of the fourth transistor T4.

Hereinafter, operations of the circuits included in the scan signal generation circuits SR[1] to SR[m] will be described. However, for ease of understanding, description will be made based on the first scan signal generation circuit SR[1].

Figure 12:
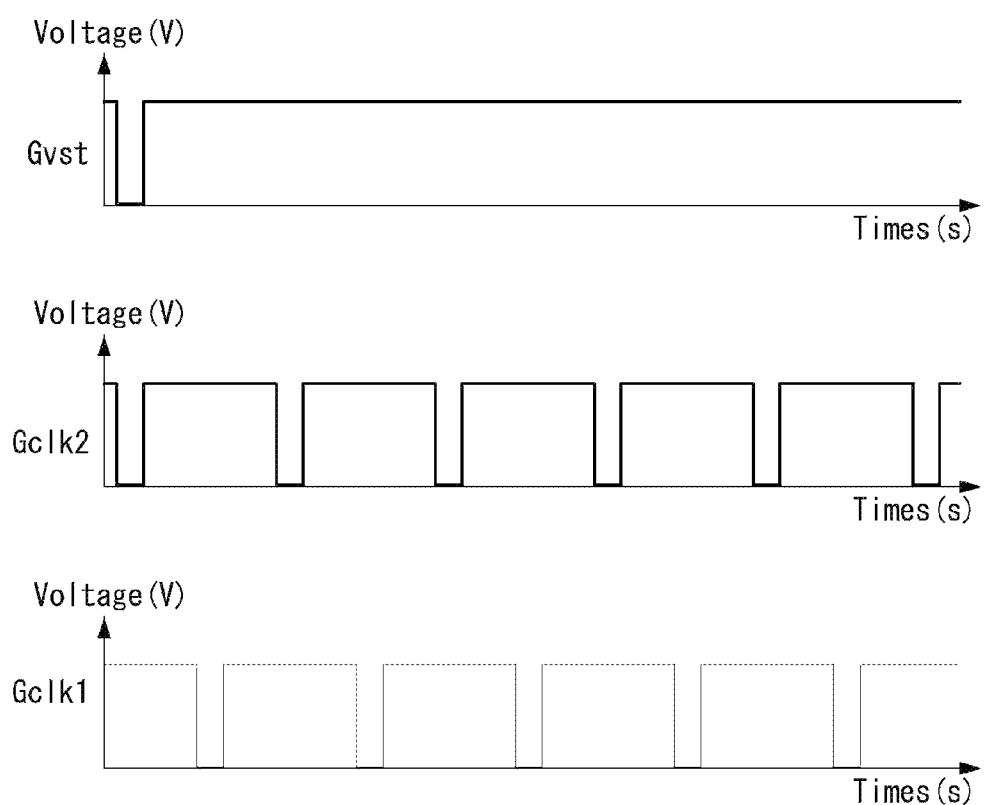
FIG. 12 is an exemplary input waveform diagram illustrating an operation of a first scan signal generation circuit unit according to an embodiment of the present disclosure.
Figure 13:
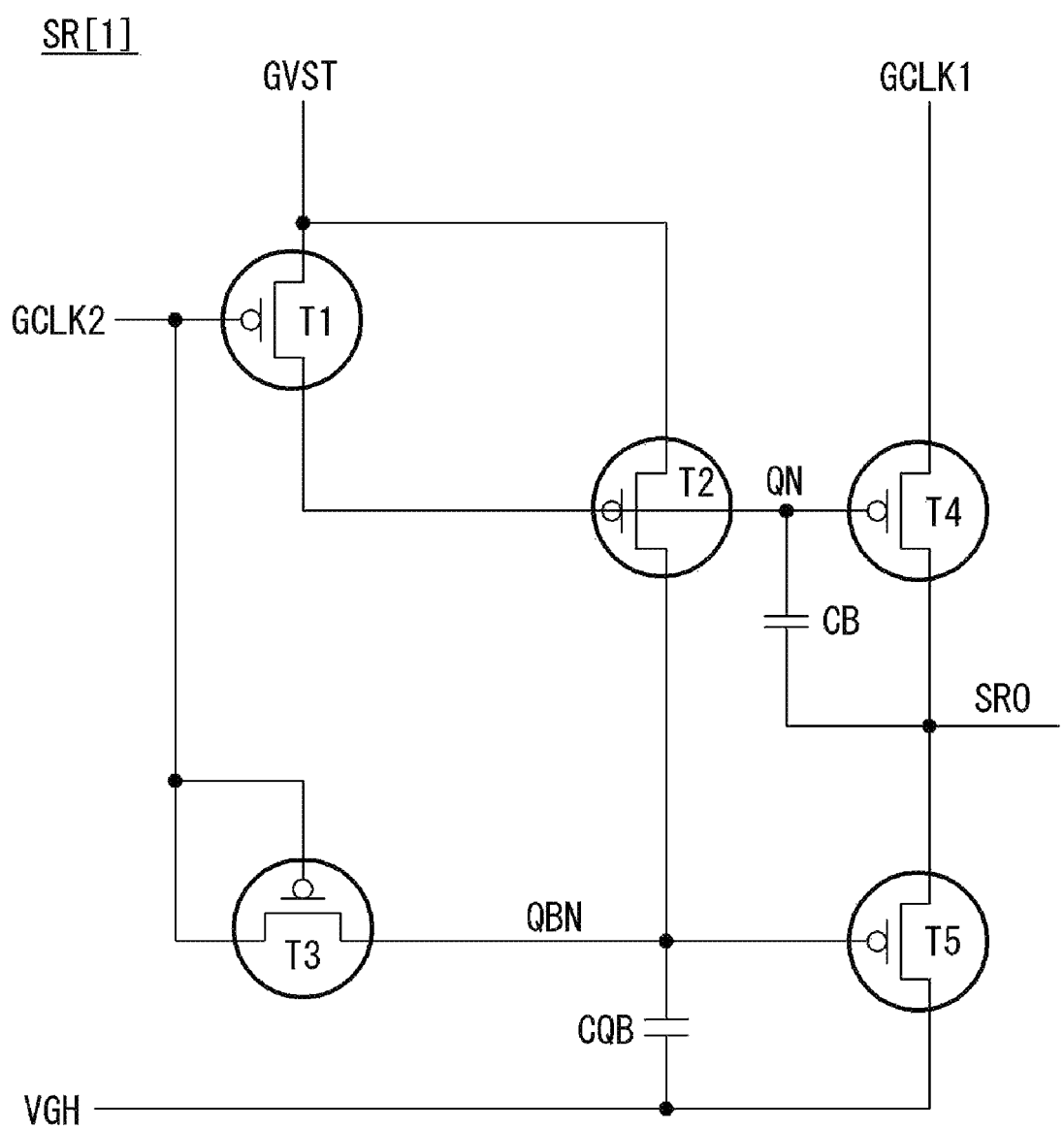
FIGS. 13 and 14 are exemplary views illustrating an operation of a first scan signal generation circuit unit according to the waveforms of FIG. 12.
Figure 14:
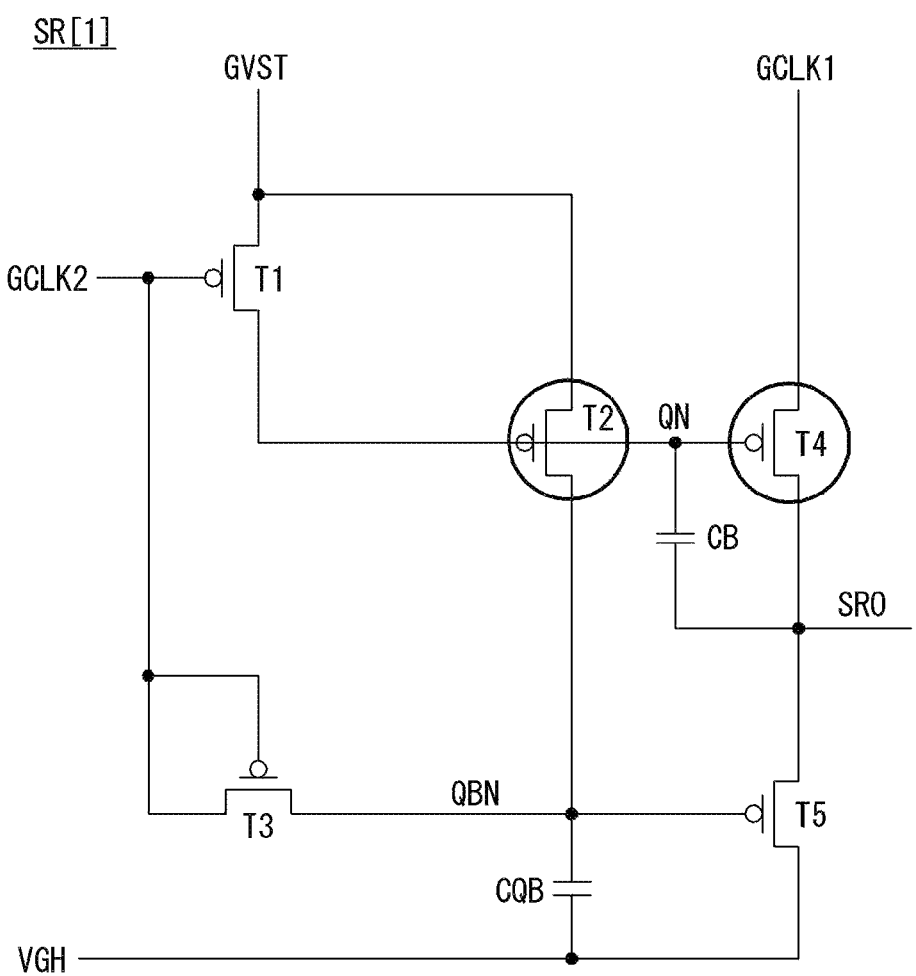
Figure 15:
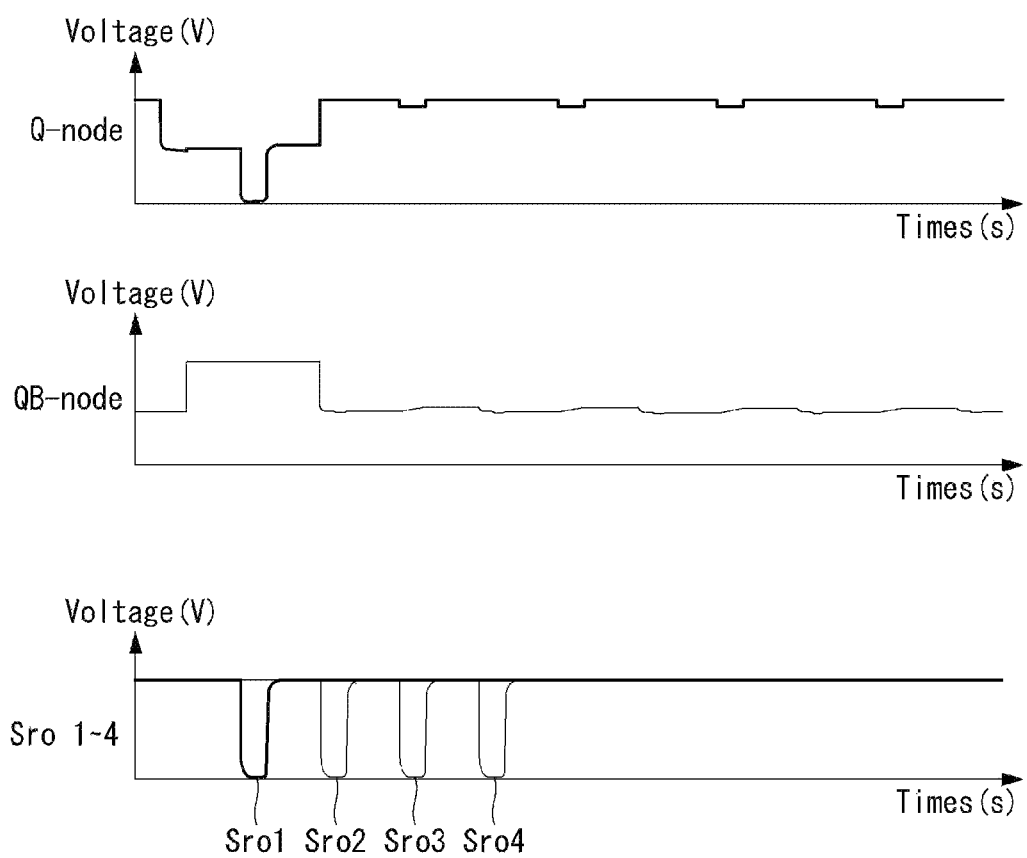
FIG. 15 is an exemplary diagram illustrating node waveforms and output waveforms of the first scan signal generation circuit unit according to the waveforms of FIG. 12.

FIG. 12 is an exemplary input waveform illustrating an operation of the first scan signal generation circuit unit according to an embodiment of the present disclosure, FIGS. 13 and 14 are exemplary views illustrating an operation of the first scan signal generation circuit unit according to the waveforms of FIG. 12, and FIG. 15 is an exemplary diagram illustrating a node waveform and an output waveform of the first scan signal generation circuit unit according to the waveforms of FIG. 12

As illustrated in FIG. 12, the start signal Gvst is created in such a form as to generate a logic low level at a specific time and then maintain a logic high level. The second clock signal Gclk2 is created in such a form as to generate a logic low level in synchronization with the logic low level of the start signal during the first time period, generate a logic high level during the second time period, and then generate a logic low level during the third time period, in a repetitive manner.

The first clock signal Gclk1 has a delayed time than the second clock signal Gclk2, and is crated in such a form as to generate a logic high level during a first time period, generate a logic low level during a second time period, and then generate a logic high level during a third time period, in a repetitive manner. In the case of the second clock signal Gclk2 and the first clock signal Gclk1, the time for which the logic low level is maintained is not overlapped (non-overlapping), but the time for which the logic high level is maintained is partially overlapped.

As shown in FIGS. 12, 13, and 15, the second clock signal Gclk2 is applied as a logic low level in synchronization with the logic low level of the start signal Gvst during the first time period, whereas the first clock signal Gclk1 is applied as a logic high level.

During the first time period, the first transistor T1 is turned on by the second clock signal Gclk2 of a logic low level applied to the gate electrode. The second transistor T2 is turned on in response to the potential (Q-node) of the Q node QN. The third transistor T3 is turned on by the second clock signal Gclk2 of a logic low level applied to the gate electrode. The fourth transistor T4 is turned on in response to the potential (Q-node) of the Q node QN. The fifth transistor T5 is turned on in response to the potential QB-node of the QB node QBN. For example, the first transistor T1, the second transistor T2, the third transistor T3, the fourth transistor T4, and the fifth transistor T5 of the first scan signal generation circuit SR[1] are turned on during the first time period.

According to the above operation, the Q node QN is charged with a logic low level voltage in response to the start signal Gvst of a logic low level applied through the turned-on first transistor T1. In addition, the QB node QBN is charged with a logic low level voltage in response to the start signal Gvst of a logic low level applied through the turned-on second transistor T2. In the state that the Q node QN is charged with a logic low level voltage, the QB node QBN is also temporarily charged with a logic low level voltage.

When the fourth transistor T4 and the fifth transistor T5 are turned on at the same time, the first clock signal Gclk1 of a logic high level is applied through the fourth transistor T4, and the scan high voltage is transmitted through the fifth transistor T5.

As a result, the first scan signal generation circuit SR[1] outputs a logic high level scan signal through its output terminal SRO during a first time period. For an output waveform related to a scan signal of a logic high level that is output through the output terminal SRO of the first scan signal generation circuit SR[1], refer to a part that maintains a logic high level before falling to a logic low level at a "Sro1" in FIG. 15.

As shown in FIGS. 12, 14, and 15, during the second time period, the second clock signal Gclk2 has a transition of a pulse from a logic low level to a logic high level, and the first clock signal Gclk1 has a transition of a pulse from logic high level to logic low level.

During the second time period, the first transistor T1 is turned off by the second clock signal Gclk2 of a logic high level applied to the gate electrode. The second transistor T2 is turned on in response to the potential (Q-node) of the Q node QN. The third transistor T3 is turned off by the second clock signal Gclk2 of a logic high level applied to the gate electrode. The fourth transistor T4 is turned on in response to the potential (Q-node) of the Q node QN. The fifth transistor T5 is turned off in response to the potential QB-node of the QB node QBN. For example, the second transistor T2 and the fourth transistor T4 of the first scan signal generation circuit SR[1] have a turn-on state during the second time period, whereas the first transistor T1, the third transistor T3, and the fifth transistor T5 have a turn-off state.

According to the above operation, the Q node QN is charged with a lower voltage in the second time period compared to the first time period due to a bootstrapping effect by the first capacitor CB. The fourth transistor T4 is turned on and the first clock signal Gclk1 of a logic low level is applied through the fourth transistor T4.

As a result, the first scan signal generation circuit SR[1] outputs the scan signal of a low logic through its output terminal SRO during the second time period. For the output waveform related to the scan signal of the logic low level output through the output terminal SRO of the first scan signal generation circuit SR[1], refer to a part falling to a logic low level at "Sro1" in FIG. 15.

With the flow of the operation described before, the first scan signal of a logic low level, such as "Sro1", is output from the first scan signal generation circuit SR[1], and after a predetermined time delay, a second scan signal of a logic low level, such as "Sro2", is output from the second scan signal generation circuit. Then, a third scan signal of a logic low level, such as "Sro3", is output from the third scan signal generation circuit, and after a predetermined time delay, a fourth scan signal of logic low level, such as "Sro4", is output from the fourth scan signal generation circuit.

The present disclosure described above can provide a shift register of a 5T2C structure including two node control transistors (switch TR), one reset transistor (diode role TR), two capacitors, and two buffer transistors, that operates on the basis of one constant voltage (VGH) and two clock signals.

As described, the present disclosure has an advantageous effect of providing a scan driver and a display device having the same, which are capable of simplifying the circuit configuration in such a manner as to stably output a scan signal even when a clock signal and a constant voltage are used at a minimum. In addition, according to the present disclosure, since it is possible to significantly reduce the number of transistors, signal lines, and voltage lines included in the shift register when configuring the scan driver, there is an advantageous effect of easily implementing the display device with a narrow bezel.

Although the embodiments of the present disclosure have been described above with reference to the accompanying drawings, it will be understood that the technical configuration of the present disclosure described above is in other specific forms without changing the technical spirit or essential features of the present disclosure by those skilled in the art to which the present disclosure pertains. Therefore, the embodiments described above are to be understood in all respects as illustrative and not restrictive. In addition, the scope of the present disclosure is indicated by the claims below, rather than the detailed description. In addition, all modifications or variations derived from the meaning and scope of the claims and their equivalent concepts should be construed as being included in the scope of the present disclosure.

What is claimed is:
1. A display device, comprising:
   a display panel configured to display an image; and
   a scan driver having a scan signal generation circuit that
      supplies a scan signal to the display panel, wherein the scan signal generation circuit comprises:
a first transistor configured to control charging and discharging of a Q node,
a second transistor configured to control charging and discharging of a QB node,
a third transistor configured to reset the QB node,
a fourth transistor configured to output a scan signal of a logic low level in response to a potential of the Q node, and
a fifth transistor configured to output a scan signal of a logic high level in response to a potential of the QB node.

2. The display device of claim 1, wherein at least one of the first to fifth transistors is a p-type thin film transistor.

3. The display device of claim 1, wherein the scan signal generation circuit is connected to two clock signal lines, one start signal line, and one constant voltage line.

4. The display device of claim 1, wherein the third transistor has a diode connection state in which a gate electrode and a first electrode are commonly connected.

5. The display device of claim 1, wherein the first transistor has a gate electrode connected to a second clock signal line through which a second clock signal is transmitted, a first electrode connected to a start signal line through which a start signal is transmitted, and a second electrode connected to the Q node,
the second transistor has a gate electrode connected to the Q node, a first electrode connected to the start signal line, and a second electrode connected to the QB node,
the third transistor has a gate electrode and a first electrode connected to the second clock signal line, and a second electrode connected to the QB node,
the fourth transistor has a gate electrode connected to the Q node, a first electrode connected to the first clock signal line through which a first clock signal is transmitted, and a second electrode connected to an output terminal of the scan signal generation circuit, and
the fifth transistor has a gate electrode connected to the QB node, a first electrode connected to a scan high voltage line through which a scan high voltage is transmitted, and a second electrode connected to an output terminal of the scan signal generation circuit.

6. The display device of claim 5, wherein the scan signal generation circuit further includes:
a first capacitor having one end connected to the Q node and another end connected to the output terminal of the scan signal generation circuit; and
a second capacitor having one end connected to the QB node and another end connected to the scan high voltage line.

7. The display device of claim 5, wherein the second clock signal is generated as a logic low level in synchronization with a logic low level of the start signal during a first period, and then generated as a logic high level during a second time period, the first clock signal is generated as a logic high level during the first time period and then generated as a logic low level during the second time period, and
the second clock signal and the first clock signal have a logic low level that is non-overlapping with each other.

8. A scan driver, comprising:
a level shifter; and
a shift register having a scan signal generation circuit that operates based on a two-phase clock signal output from the level shifter,
wherein the shift register comprises:
a first transistor configured to control charging and discharging of a Q node,
a second transistor configured to control charging and discharging of a QB node,
a third transistor configured to reset the QB node,
a fourth transistor configured to output a scan signal of a logic low level in response to a potential of the Q node, and
a fifth transistor configured to output a scan signal of a logic high level in response to a potential of the QB node.

9. The scan driver of claim 8, wherein the first transistor has a gate electrode connected to a second clock signal line through which a second clock signal is transmitted, a first electrode connected to a start signal line through which a start signal is transmitted, and a second electrode connected to the Q node, and
the second transistor has a gate electrode connected to the Q node, a first electrode connected to the start signal line, and a second electrode connected to the QB node.

10. The scan driver of claim 9, wherein the third transistor has a gate electrode and a first electrode connected to the second clock signal line, and a second electrode connected to the QB node,
the fourth transistor has a gate electrode connected to the Q node, a first electrode connected to the first clock signal line through which a first clock signal is transmitted, and a second electrode connected to an output terminal of the scan signal generation circuit, and
the fifth transistor has a gate electrode connected to the QB node, a first electrode connected to a scan high voltage line through which a scan high voltage is transmitted, and a second electrode connected to the output terminal of the scan signal generation circuit.

11. The scan driver of claim 10, wherein the scan signal generation circuit further includes:
a first capacitor having one end connected to the Q node and another end connected to the output terminal of the scan signal generation circuit; and
a second capacitor having one end connected to the QB node and another end connected to the scan high voltage line.

* * * * *